United States Patent
Marukame et al.

(10) Patent No.: US 8,357,962 B2
(45) Date of Patent: Jan. 22, 2013

(54) SPIN TRANSISTOR AND METHOD OF MANUFACTURING THE SAME

(75) Inventors: Takao Marukame, Fuchu (JP); Mizue Ishikawa, Yokohama (JP); Tomoaki Inokuchi, Kawasaki (JP); Hideyuki Sugiyama, Kawasaki (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 374 days.

(21) Appl. No.: 12/700,767

(22) Filed: Feb. 5, 2010

(65) Prior Publication Data

US 2010/0200899 A1  Aug. 12, 2010

(30) Foreign Application Priority Data

Feb. 10, 2009 (JP) .................................. 2009-028943

(51) Int. Cl.
*H01L 21/336* (2006.01)

(52) U.S. Cl. ........................................................ 257/295

(58) Field of Classification Search ....... 438/3; 257/295
See application file for complete search history.

(56) References Cited

U.S. PATENT DOCUMENTS

| | | | |
|---|---|---|---|
| 6,963,091 B1* | 11/2005 | Vashchenko et al. | ......... 257/213 |
| 7,200,037 B2 | 4/2007 | Saito et al. | |
| 7,411,235 B2 | 8/2008 | Saito et al. | |
| 7,602,636 B2 | 10/2009 | Saito et al. | |
| 2008/0019060 A1* | 1/2008 | Mizuno et al. | ........... 360/324.12 |
| 2008/0239930 A1* | 10/2008 | Saito et al. | ................... 369/126 |
| 2010/0171158 A1* | 7/2010 | Sugahara et al. | ............. 257/295 |

FOREIGN PATENT DOCUMENTS

| | | |
|---|---|---|
| JP | 8-255912 | 10/1996 |
| JP | 2007-42802 | 2/2007 |
| JP | 2008-243922 | 10/2008 |
| JP | 2008-243992 | 10/2008 |

OTHER PUBLICATIONS

Japanese Office Action issued on Jan. 4, 2011, in Japanese Patent Application No. 2009-028943 (with English Translation).
Kuniaki Sugiura et al., "Schottky barrier height of ferromagnet/ Si(001) junctions", Applied Physics Letters, vol. 89, 072110, (2006), 3 pages.
Satoshi Sugahara et al., "A spin metal-oxide-semiconductor field-effect transistor using half-metallic-ferromagnet contacts for the source and drain", Applied Physics Letters, vol. 84, No. 13, (2004), pp. 2307-2309.

* cited by examiner

*Primary Examiner* — Thao P. Le
(74) *Attorney, Agent, or Firm* — Oblon, Spivak, McClelland, Maier & Neustadt, L.L.P.

(57) ABSTRACT

A spin transistor includes a source electrode, a drain electrode, and a gate electrode on a semiconductor substrate. At least one of the source electrode and the drain electrode includes a semiconductor region and a magnetic layer. The semiconductor region is formed in the semiconductor substrate. The magnetic layer is formed on the semiconductor region, and contains a crystalline Heusler alloy containing at least one of cobalt (Co) and iron (Fe). The semiconductor region and the magnetic layer contain the same impurity element.

16 Claims, 5 Drawing Sheets

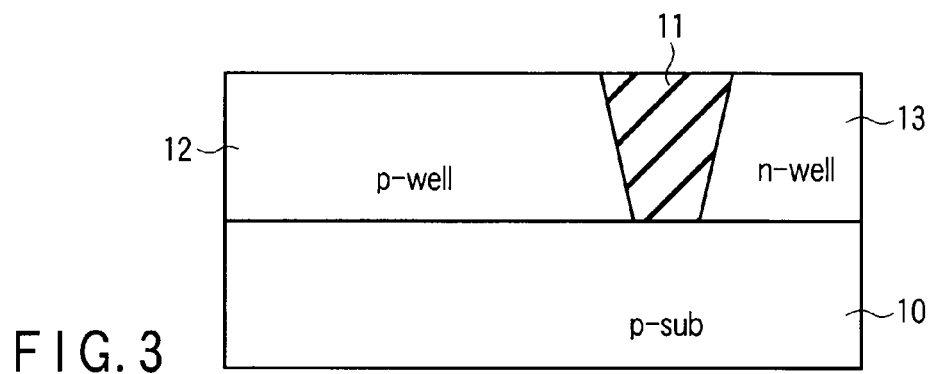
F I G. 3
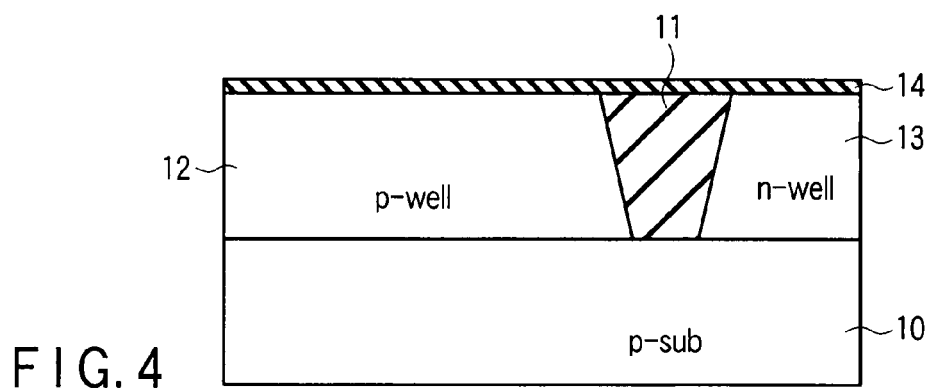
F I G. 4
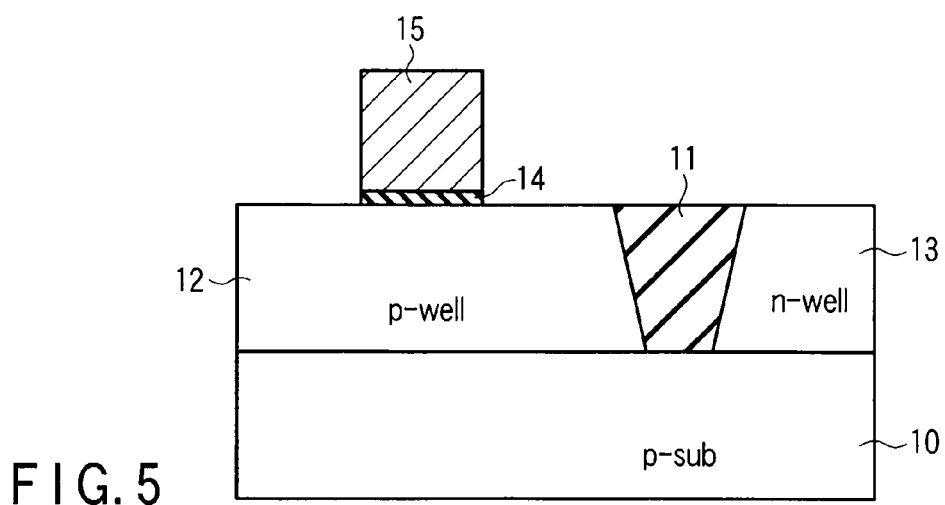
F I G. 5

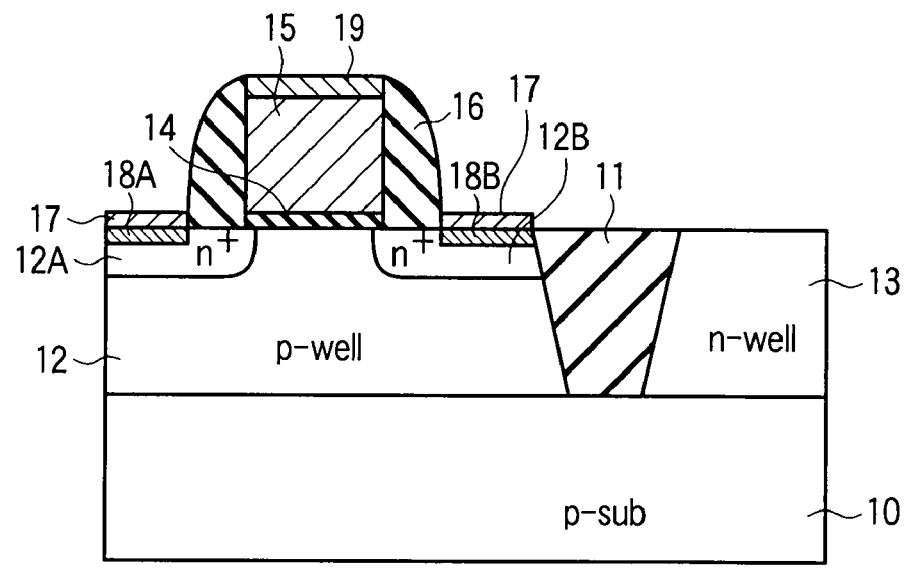
F I G. 9
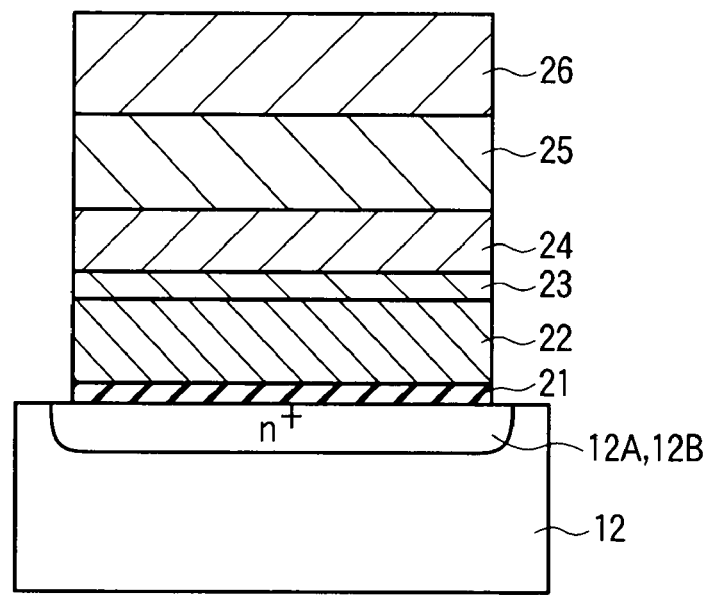
F I G. 10

SPIN TRANSISTOR AND METHOD OF MANUFACTURING THE SAME

CROSS-REFERENCE TO RELATED APPLICATIONS

This application is based upon and claims the benefit of priority from prior Japanese Patent Application No. 2009-028943, filed Feb. 10, 2009, the entire contents of which are incorporated herein by reference.

BACKGROUND OF THE INVENTION

1. Field of the Invention

The present invention relates to the electrode structure of a spin transistor and a method of manufacturing the same.

2. Description of the Related Art

Recently, a magnetic memory (to be also referred to as an MRAM (Magnetic Random Access Memory) hereinafter) using an MTJ element having a magnetic tunnel junction (to be also referred to as an MTJ (Magnetic Tunnel Junction) hereinafter) made of a stacked structure including a ferromagnetic material layer/insulator layer (tunnel barrier)/ferromagnetic material layer as a memory element has been proposed. In this MRAM, the resistance of the stacked structure is changed by magnetization direction in one ferromagnetic material layer (a reference layer or fixed layer), and controlling spins in the other ferromagnetic material layer (a recording layer or free layer), thereby storing a high-resistance state or low-resistance state by making it correspond to data "0" or "1". For example, the resistance is low when the spins in the reference layer and recording layer are parallel, and high when the spins in these layers are antiparallel. The magnetoresistance ratio (MR ratio) of this MTJ element has recently reached 500%, although it was a few 10% at room temperature a few years ago. This expands the possibilities of MTJ elements, enabling a variety of spin devices as well as the MRAM to be obtained. As an example, a spin MOS field-effect transistor (to be referred to as a spin MOSFET hereinafter) has been proposed (see, e.g., S. Sugahara and M. Tanaka, Appl. Phys. Lett. 84 (2004) 2307). This spin MOSFET uses a ferromagnetic material in the source and drain electrode portions of a normal MOSFET. This employs the degree of freedom of spins of carriers in the device operation. By using this function, the MTJ element is expected to be applied to a reconfigurable circuit such as an FPGA.

As described above, the MR ratio of the MTJ has increased. However, to control a spin-polarized electric current by the gate voltage in the spin MOSFET, it is important to inject an electric current (to be also referred to as a highly spin-polarized electric current hereinafter) having a highly spin-polarized electron ratio from a magnetic layer in a source portion into a channel. Also, in the spin MOSFET and MTJ, the magnetoresistive effect (MR) controlled by the relative magnetization directions in two magnetic layers sandwiching a non-magnetic layer is the basic operation principle of the device.

According to the basic principle of the spin MOSFET, it is essential to achieve an appropriate interface resistance between a semiconductor substrate and magnetic layer. As a method of controlling the interface resistance, a method of inserting a tunnel barrier layer has been disclosed. On the other hand, a method of forming a heavily doped impurity region in a semiconductor substrate by ion implantation has been used as a method of achieving a low resistance. To improve the performance of the spin MOSFET, it is necessary to suppress the interface resistance to typically about 10 $\Omega\mu m^2$. Also, when performing spin-torque transfer (STT) in a write method using spin transfer in the spin MOSFET and MTJ, no spin reversal occurs unless an electric current having a very high current density is supplied to an element. When an electric current having a high current density is supplied to a magnetoresistive effect element having a tunnel barrier layer, element destruction occurs because a high electric field is applied to the tunnel barrier. Accordingly, a structure that causes spin reversal by an electric current having a low current density is required for STT. This also makes it essential to decrease the interface resistance.

As the electrode structure of the spin MOSFET, (1) a Schottky barrier type electrode structure and (2) a tunnel barrier type electrode structure have been proposed. As electrode structure (1), a low Schottky barrier of MnAs/Si has been reported (see, e.g., K. Sugiura et al., APL 89 (2006) 072110).

As explained above, in the magnetoresistive effect element, magnetic memory, and spin MOSFET, it is essential not only to generate and inject a highly spin-polarized electric current but also to control the interface resistance in order to improve the performance. In the interface of a metal layer/Si, the resistance increases because a Schottky barrier is formed. Also, even in a metal layer/tunnel barrier/Si, the resistance increases because a depletion layer behaved as Schottky-like component is formed in the tunnel barrier/Si by the influence of Fermi level pinning. Conventionally, these Schottky components are effectively reduced by forming a heavily doped impurity region in a semiconductor substrate by ion implantation. On the other hand, a simpler process is necessary for applications. Therefore, demands have arisen for a technique that decreases the resistance by new impurity engineering in the interface between a magnetic material and Si.

One promising solution for improving the performance of the spin MOSFET is an electrode structure obtained by combining a Heusler alloy and crystalline tunnel barrier. However, a general conventional method is to form a Heusler alloy by sputtering by using a sputtering target having a matched composition ratio. When directly depositing a film on an Si substrate, therefore, impurity diffusion from the Si substrate has an influence on the crystallinity. In addition, annealing is performed to improve the crystallinity after the Heusler alloy has grown. Since this mixes Si and the magnetic material around the interface, the magnetic properties degrade.

BRIEF SUMMARY OF THE INVENTION

According to a first aspect of the present invention, there is provided a spin transistor comprising: a source electrode, a drain electrode, and a gate electrode on a semiconductor substrate, at least one of the source electrode and the drain electrode including: a semiconductor region formed in the semiconductor substrate; and a magnetic layer formed on the semiconductor region, and containing a crystalline Heusler alloy containing at least one of cobalt (Co) and iron (Fe). The semiconductor region and the magnetic layer contain the same impurity element.

According to a second aspect of the present invention, there is provided a spin transistor comprising: a source electrode, a drain electrode, and a gate electrode on a semiconductor substrate, at least one of the source electrode and the drain electrode including: a semiconductor region formed in the semiconductor substrate; a magnetic silicide layer formed on the semiconductor region, and containing at least one of cobalt (Co) and iron (Fe); and a magnetic layer formed on the magnetic silicide layer, and containing at least one of cobalt (Co) and iron (Fe). The semiconductor region, the magnetic silicide layer, and the magnetic layer contain the same impurity element, and the magnetic silicide layer has a spin polarization higher than that of the magnetic layer.

According to a third aspect of the present invention, there is provided a method of manufacturing a spin transistor comprising: forming a gate electrode on a semiconductor substrate; forming a source electrode on the semiconductor substrate; and forming a drain electrode on the semiconductor substrate. At least one of the forming the source electrode and the forming the drain electrode includes forming a magnetic layer containing an impurity on the semiconductor substrate; and annealing the magnetic layer to form a semiconductor region by diffusing the impurity contained in the magnetic layer into the semiconductor substrate, and change the magnetic layer to have a composition and crystal structure of a Heusler alloy.

According to a fourth aspect of the present invention, there is provided a method of manufacturing a spin transistor comprising: forming a gate electrode on a semiconductor substrate; forming a source electrode on the semiconductor substrate; and forming a drain electrode on the semiconductor substrate. At least one of the forming the source electrode and the forming the drain electrode includes forming a magnetic layer containing an impurity on the semiconductor substrate in at least one of the source electrode and the drain electrode; and annealing the magnetic layer to form a semiconductor region by diffusing the impurity contained in the magnetic layer into the semiconductor substrate, and form a magnetic silicide layer by siliciding the magnetic layer. The magnetic silicide layer has a spin polarization higher than that of the magnetic layer.

BRIEF DESCRIPTION OF THE SEVERAL VIEWS OF THE DRAWING

FIG. 3 is a sectional view showing the first step of an n-type spin MOSFET manufacturing method of a first embodiment of the present invention;

FIG. 4 is a sectional view showing the second step of the manufacturing method of the first embodiment;

FIG. 5 is a sectional view showing the third step of the manufacturing method of the first embodiment;

FIG. 9 is a sectional view of the n-type spin MOSFET of the first embodiment;

FIG. 10 is a sectional view of a source/drain portion of an n-type spin MOSFET of a second embodiment of the present invention;

DETAILED DESCRIPTION OF THE INVENTION

Figure 1A:
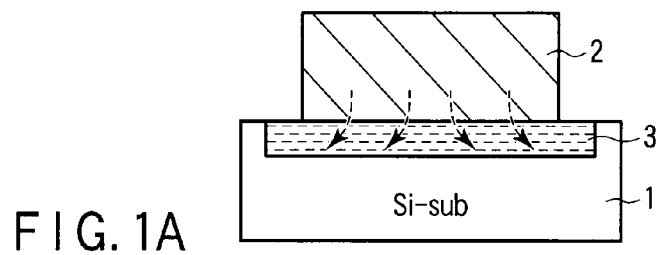
FIGS. 1A and 1B are views showing an outline of an embodiment of the present invention.

First, how the present invention is achieved and the principle of the present invention will be explained below before the explanation of embodiments of the present invention.

As explained in "Description of the Related Art", it is important to reduce the interface resistance between a magnetic layer and Si substrate in order to improve the performance of the spin MOSFET. In a source/drain type spin MOSFET having a Schottky barrier, the interface resistance is represented by expression (1) below by using the Schottky barrier height and interface impurity concentration. In expression (1), $\rho_C$ is the interface resistance, $\epsilon_S$ is the dielectric constant of silicon (Si), m* is the effective mass of a carrier, h is Planck's constant, $\phi_B$ is the Schottky barrier height (SBH), and $N_D$ is the impurity concentration in silicon. When using general non-magnetic NiSi as the source/drain electrodes of a normal MOSFET, $2\ \Omega\mu m^2$ is obtained at an As concentration of $2.0\times10^{20}\ cm^{-3}$.

$$\rho_C \propto \exp\left\{\frac{2\sqrt{\varepsilon_S m^*}}{\hbar}\left(\frac{\phi_B}{\sqrt{N_D}}\right)\right\} \quad (1)$$

According to expression (1), the interface resistance can be reduced by increasing $N_D$.

To manufacture a spin MOSFET, the present inventors manufactured Schottky diodes by using CoFe-based magnetic materials as the electrodes and changing the substrate impurity concentration, and evaluated the manufactured diodes. Consequently, expression (1) generally held even when using the CoFe-based magnetic materials. However, an impurity predoped in the substrate was absorbed by the magnetic material by annealing for manufacturing the spin MOSFET, so the concentration in the interface was necessarily lower than the concentration of the impurity predoped in the Si bulk.

Practical examples are as follows. First, As was doped in an Si substrate by ion implantation to form an n-type diffusion layer of about $1\times10^{20\ atoms}/cm^3$, and activation annealing was performed. After that, a stacked structure including $CO_{50}Fe_{50}$ was deposited as a magnetic electrode by sputtering. Then, to improve the quality of the Si/CoFe interface and define the direction of easy magnetization of the magnetic electrode, annealing was performed at 300° C. for at least 1 hr in a magnetic field of about 5 kOe. Consequently, it was found by analysis performed in the direction of depth by using secondary ion mass spectroscopy (SIMS) that the As concentration in the CoFe interface significantly decreased on the Si side compared to that before annealing, and increased in the CoFe layer instead. On the other hand, CoFe started silicidation from typically about 300° C., depending on the deposition conditions and thermal history. It was simultaneously confirmed that the Kirkendall effect obtained by the silicidation caused an impurity rejecting effect, i.e., a so-called impurity snowplow effect. However, the present inventors did not find any method of forming a heavily doped impurity interface without deteriorating the properties of a magnetic material.

On the other hand, the present inventors made extensive studies and have found that when an impurity is premixed in CoFe, this CoFe containing the impurity initially grows as an amorphous layer on an Si substrate. Then, the present inventors have found that when CoFe initially grows as an amorphous layer, a flat, steep, high-quality interface readily forms when CoFe reacts with Si after that.

The present inventors have found that when a magnetic silicide is formed by adding annealing after CoFe containing an impurity is deposited on an Si substrate, the impurity diffuses from the magnetic layer to the Si side, and continuous, high-concentration impurity segregation occurs in the interface between Si and the silicide. The present inventors have further found that when a magnetic layer is deposited and high-temperature annealing is performed, silicidation of the magnetic layer can be utilized. First, as a magnetic layer containing an impurity, a layer obtained by mixing phosphorus (P) or the like in, e.g., CoFe was deposited as an amorphous layer. For example, CoFe containing 20 at % of P, i.e., $(CoFe)_{80}P_{20}$ was deposited on an undoped Si substrate. When the composition ratio of Co to Fe was 2:1, a full-Heusler alloy $(CO_2FeSi)$ was formed when silicidation was performed by annealing. Simultaneously with this silicidation, most of the impurity diffused toward the Si substrate. The annealing temperature controls the degree of order of the full-Heusler alloy. This increases the spin polarization of the Heusler alloy and decreases the interface resistance by impurity segregation at the same time.

The above explanation generally holds regardless of the type of impurity. When using an n-type impurity as an element to be added to a magnetic material, it is possible to use any of lithium (Li), phosphorus (P), arsenic (As), antimony (Sb), and bismuth (Bi), or a combination of two or more types of these elements. When using a p-type impurity, it is possible to use any of boron (B), aluminum (Al), gallium (Ga), indium (In), magnesium (Mg), and beryllium (Be), or a combination of two or more types of these elements.

Furthermore, although the silicidation of CoFe has been explained above, the explanation holds for a CoMn alloy as well. For example, silicidation as a full-Heusler alloy occurred even when using $(CO_2Mn_1)_{80}P_{20}$ obtained by mixing P in $CO_2Mn_1$. This silicidation holds not only for CoMn but also for CoCr. In addition, the silicidation holds for an Fe-based, full-Heusler alloy, e.g., FeMn.

Also, an Si substrate is used as the semiconductor substrate in the above explanation. However, an Si, Ge, or Si—Ge semiconductor layer need only be grown on at least the surface, and the semiconductor layer can be either a single-crystal layer or polycrystalline layer. The same effect can be obtained by using, as a substrate for growing these semiconductors, any of a substrate having GaAs single crystal, Si—Ge single crystal, or SiC single crystal, an SOI (Silicon On Insulator) substrate, an InGaAs substrate, a III-V compound semiconductor substrate, and a II-VI semiconductor substrate.

Note that a Heusler alloy (also called a full-Heusler alloy) is a general term for intermetallic compounds having a chemical composition $X_2YZ$. X is a transition metal element or noble metal element of Co, Fe, Ni, or Cu on the periodic table. Y is a transition metal of Mn, V, Cr, or Ti, and can also be the same type of element as X. Z is a typical element of groups III to V, or group II or VI. Examples of the group-III element are Ga and In, examples of the group-IV element are C, Si, and Ge, and an example of the group-V element is As.

Outlines of embodiments of the present invention will be explained below with reference to FIGS. 1A, 1B, and 2.

A CoFe-based material having a high Curie temperature (Tc) is used as a magnetic layer, and an impurity (e.g., As, P, or B) serving as a dopant for a semiconductor is added to the magnetic layer, thereby using self-diffusion of the impurity from the magnetic layer to a semiconductor substrate such as Si.

Figure 2:
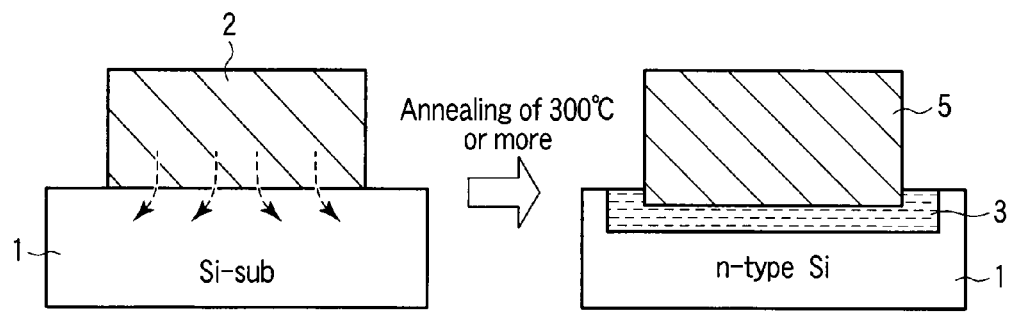
FIG. 2 is a view showing the outline of the embodiment of the present invention.

When a magnetic layer 2 made of a CoFe-based material is directly deposited on an Si semiconductor substrate 1 as shown in FIG. 1A, low-temperature annealing can cause only impurity diffusion, so an impurity region 3 is formed in the Si substrate 1. Also, when performing high-temperature annealing at 300° C. or more, silicidation of the magnetic layer 2 occurs in addition to the impurity diffusion.

Figure 1B:
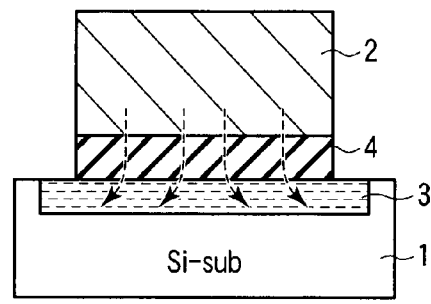

When a tunnel barrier 4 is formed on a Si substrate 1 and a magnetic layer 2 is deposited on the tunnel barrier 4 as shown in FIG. 1B, an impurity in the magnetic layer 2 diffuses to the Si substrate 1 through the tunnel barrier 4.

The two types of impurity diffusion described above produce a strong band bending in Si, thereby effectively lowering the barrier. This makes it possible to decrease the resistance of the interface between the magnetic layer and Si substrate in the structure in which the magnetic layer is directly formed on the Si substrate shown in FIG. 1A. This also makes it possible to decrease the resistance between the magnetic layer and Si substrate in the structure in which the tunnel barrier is formed between the Si substrate and magnetic layer as shown in FIG. 1B.

Silicidation can be used when directly depositing a magnetic layer on an Si substrate and performing high-temperature annealing. First, as shown in FIG. 2, an impurity-containing magnetic layer (a layer obtained by mixing phosphorus (P) or the like in CoFe or $CoMn)_2$ is deposited as an amorphous layer on an Si substrate 1. When the atomic composition ratio of Co to Fe (Co to Mn) is 2:1, the magnetic layer 2 changes into a full-Heusler alloy $(CO_2FeSi)$ 5 when silicided by annealing. The impurity diffuses toward the Si substrate simultaneously with this silicidation. This increases the spin polarization of the Heusler alloy and decreases the interface resistance by impurity segregation at the same time.

Embodiments of the present invention will be explained in detail below with reference to the accompanying drawing. In the following explanation, the same reference numerals denote the same parts throughout the drawing. In the embodiments of the present invention, an n-type spin MOSFET formed on an Si semiconductor substrate and a method of manufacturing the same will be explained. Note that the semiconductor substrate is not limited to silicon, and it is also possible to use another semiconductor substrate, e.g., a semiconductor substrate made of germanium (Ge) or a mixed crystal of Si and Ge. Furthermore, the present invention is of course applicable to a p-type spin MOSFET as well as an n-type spin MOSFET, and also applicable to other magnetic devices.

First Embodiment

An n-type spin MOSFET of the first embodiment of the present invention and a method of manufacturing the same will be explained below.

First, details of the manufacturing method will be explained with reference to FIGS. 3 to 9. As shown in FIG. 3, an element isolation region (STI (Shallow Trench Isolation)) 11 made of a silicon oxide film is formed in a p-type (100) silicon semiconductor substrate 10 in which, e.g., boron (B) is doped by about $10^{15}$ atoms/$cm^3$. After that, a first semiconductor region (p-well) 12 is formed by ion implantation of an impurity by using the element isolation region 11 as a boundary. An n-type spin MOSFET is to be formed in the first semiconductor region 12 through steps to be described later.

In addition, a second semiconductor region (n-well) 13 is formed by ion implantation of an impurity in a region adjacent to the first semiconductor region 12 with the element isolation region 11 being sandwiched between them.

Although a p-type spin MOSFET is to be formed in the second semiconductor region 13, a description of the formation will be omitted.

Then, as shown in FIG. 4, a gate insulating film 14 about 1 nm thick made of, e.g., a silicon oxide film is formed on the semiconductor region 12 by thermal oxidation. The gate insulating film 14 is of course not limited to a silicon oxide film, and it is also possible to apply an insulating film material (high-k insulating film) having a dielectric constant higher than that of a silicon oxide film. More specifically, it is possible to apply, e.g., $La_2O_5$, $La_2O_3$, $CeO_2$, $ZrO_2$, $HfO_2$, $SrTiO_3$, $PrO_3$, $LaAlO_3$, $Si_3N_4$, $Al_2O_3$, $Ta_2O_5$, or $TiO_2$ to the gate insulating film 14. It is also possible to apply an insulating film obtained by adding nitrogen or fluorine to a silicon oxide film or high-k insulating film. Furthermore, it is possible to apply an insulating film obtained by changing the composition ratio of any of these compounds, or a composite film obtained by combining a plurality of insulating films. In addition, an insulating film obtained by adding metal ions to a silicon oxide may also be applied. Examples are Zr silicate and Hf silicate.

Subsequently, a polysilicon film about 100 to 150 nm thick serving as a gate electrode is deposited on the gate insulating film 14 by low-pressure chemical vapor deposition (to be also referred to as LP-CVD hereinafter). As shown in FIG. 5, the gate insulating film 14 and the polysilicon film serving as a gate electrode are patterned by lithography and etching such as reactive ion etching (to be also referred to as RIE hereinafter), thereby forming a gate electrode 15 having a gate length of about 30 nm and a gate insulating film 14. Also, a 1- to 2-nm thick oxide film is formed by post oxidation as needed.

Similar to the examples of the gate insulating film, the material of the gate electrode is not limited to polysilicon, and a so-called metal gate material can be applied. Examples of the metal gate material are metals such as Ti, Ta, and W, and nitrides, carbides, and oxides of these metals.

Figure 6:
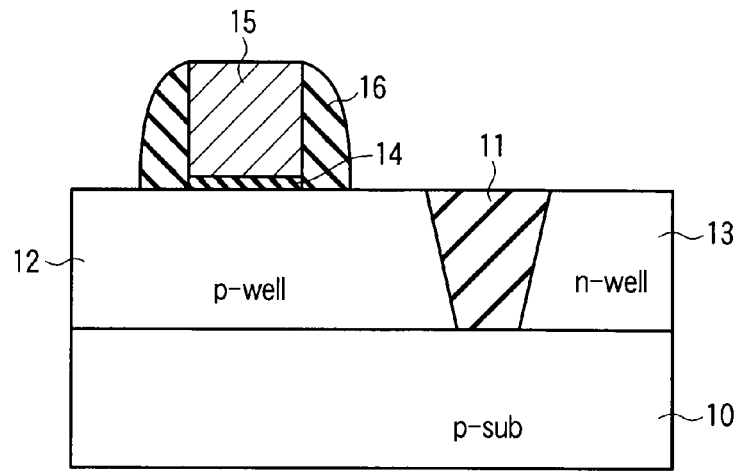
FIG. 6 is a sectional view showing the fourth step of the manufacturing method of the first embodiment.

A silicon nitride film about, e.g., 8 nm thick is deposited on the semiconductor substrate 10 by LP-CVD. After that, as shown in FIG. 6, the silicon nitride film is left behind on only the side surfaces of the gate electrode 15 by performing etch back by RIE. In this manner, sidewall insulating films 16 are formed on the side surfaces of the gate electrode 15.

Figure 7:
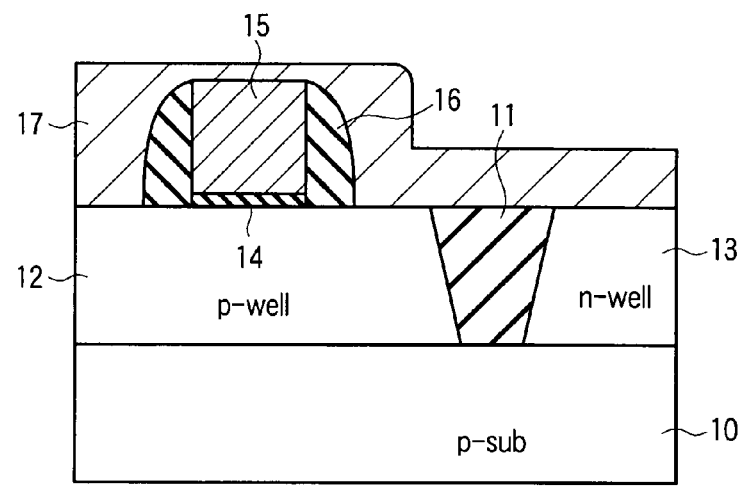
FIG. 7 is a sectional view showing the fifth step of the manufacturing method of the first embodiment.

As shown in FIG. 7, a magnetic layer, e.g., a $(CoFe)_{80}P_{20}$ film 17 about 10 nm thick is formed on the semiconductor region 12 by sputtering. In this step, the $(CoFe)_{80}P_{20}$ film 17 is deposited in contact with the region 12 serving as the source/drain regions of the spin MOSFET.

Figure 8:
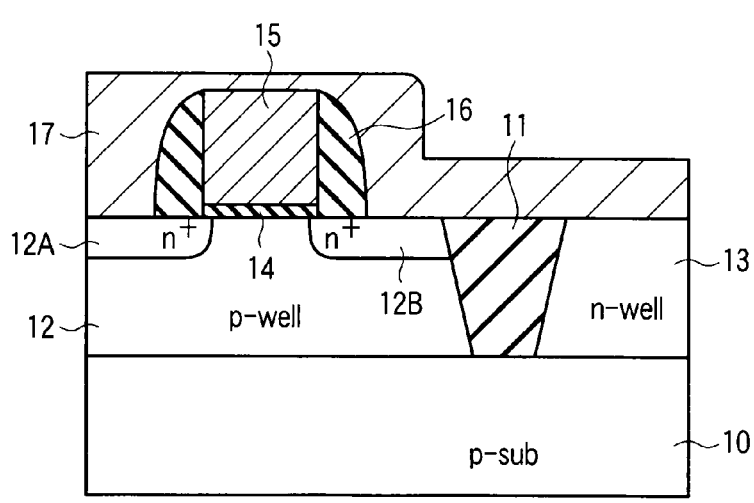
FIG. 8 is a sectional view showing the sixth step of the manufacturing method of the first embodiment.

As shown in FIG. 8, annealing is performed as first annealing at 250° C. for about 30 sec by RTA (Rapid Thermal Anneal), thereby diffusing phosphorus (P) of interior of the semiconductor region 12. In this way, $n^+$-type semiconductor regions (impurity diffusion regions) 12A and 12B as the source/drain regions are formed in the semiconductor region 12 on the two sides of the gate electrode 15.

The composition ratio of Co to Fe in the $(CoFe)_{80}P_{20}$ film is desirably 2:1 as an atomic ratio, and the temperature of the annealing is desirably lower than 300° C. as a typical temperature at which silicidation occurs. By making the annealing temperature lower than 300° C., only the impurity element can be diffused while suppressing silicidation into CoSi, FeSi, or the like.

Then, as shown in FIG. 9, annealing is performed as second annealing at 450° C. for about 30 sec by RTA to silicide CoFe in the $(CoFe)_{80}P_{20}$ film 17, i.e., silicide at least a portion of the $(CoFe)_{80}P_{20}$ film 17, thereby forming magnetic silicide layers 18A and 18B on the $n^+$-type semiconductor regions 12A and 12B, respectively. In addition, the $(CoFe)_{80}P_{20}$ film 17 is left behind as source/drain electrodes on the silicide layers 18A and 18B by performing etch back by RIE. In this step, a silicide film 19 is formed on the gate electrode 15.

In the second annealing, silicidation is performed to a depth of about 5 nm from the interface between the $n^+$-type semiconductor region and $(CoFe)_{80}P_{20}$ film 17 to the Si substrate. The silicide layers 18A and 18B formed are made of a mixed crystal of $CO_3Si$ and $Fe_3Si$, and are magnetic layers. It was confirmed in an actual spin transfer structure for silicon that this magnetic layer was capable of injecting an electric current having a high spin polarization into silicon. Also, a Heusler alloy ($CO_2FeSi$) is formed, according to the composition ratio of Co to Fe. A high spin polarization was confirmed in this case as well.

That is, this embodiment has a structure in which the magnetic silicide layers 18A and 18B in contact with silicon are formed, and the unsilicided magnetic layers 17 exist on the magnetic silicide layers 18A and 18B. The spin polarization of the magnetic silicide layer was higher than that of the original magnetic layer.

Also, this embodiment has been explained by using the gate first process of forming the gate portion (the gate insulating film 14 and gate electrode 15) before the formation of the source/drain regions 12A and 12B. However, it is, of course, also possible to use the gate last process of forming the gate portion after the formation of the source/drain regions. In the gate last process, source/drain regions are formed after a dummy gate portion is formed, and the gate portion is formed after the dummy gate portion is removed.

In the spin MOSFET of this embodiment, the interface layers between the $n^+$-type semiconductor regions 12A and 12B and magnetic silicide layers 18A and 18B have high-concentration phosphorus (P), and the concentration is, e.g., $4 \times 10^{20}$ to $1 \times 10^{21}$ atoms/cm$^3$. Note that the interface is an energy stable position for an impurity, so it is natural that the impurity concentration of the interface exceeds the impurity solid solubility limit of the Si layer bulk.

Note that even when the first annealing (low temperature) and second annealing (high temperature) are switched, or even when annealing is performed only once, a magnetic silicide layer having a high spin polarization can be formed by optimizing the process conditions. Note also that it is desirable to perform the first annealing (low temperature) and second annealing (high temperature) in order to diffuse the impurity contained in the magnetic layer to the Si substrate. To find the optimum process conditions, it is necessary to obtain a low resistance by evaluating the junction resistance of the interface between the magnetic silicide layer and Si substrate, and evaluate the spin polarization of the magnetic silicide layer. The spin polarization can be evaluated by, e.g., a method using Andreev reflection, a method of evaluating the spin polarization by a junction to a superconductor, a method of performing estimation by the tunnel magnetoresistance (TMR), or a method using XPS having spin resolution. It is, of course, also possible to form a spin MOSFET as an actual device, and evaluate the spin polarization by the magnetoresistance ratio of this spin MOSFET.

The structure of the n-type spin MOSFET of the first embodiment will be explained below with reference to FIG. 9. As shown in FIG. 9, the semiconductor region (p-well) 12 and semiconductor region (p-well) 13 are formed on the Si substrate 10. The semiconductor region (p-well) 12 and semiconductor region (p-well) 13 are isolated by the element isolation region 11. The gate insulating film 14 is formed on the semiconductor region 12, and the gate electrode 15 is formed on the gate insulating film 14. In addition, the sidewall insulating films 16 are formed on the side surfaces of the gate electrode 15, and the silicide film 19 is formed on the gate electrode 15.

The n$^+$-type semiconductor regions 12A and 12B are formed in the semiconductor region 12 on the two sides of the gate electrode 15. The magnetic silicide layers 18A and 18B are respectively formed on the n$^+$-type semiconductor regions 12A and 12B. Furthermore, the (CoFe)$_{80}$P$_{20}$ films (magnetic layers) 17 are formed on the magnetic silicide layers 18A and 18B.

The n$^+$-type semiconductor regions 12A and 12B, magnetic silicide layers 18A and 18B, and (CoFe)$_{80}$P$_{20}$ films (magnetic layers) 17 contain the same impurity, e.g., phosphorus (P). In addition, the magnetic silicide layers 18A and 18B have a spin polarization higher than that of the (CoFe)$_{80}$P$_{20}$ films (magnetic layers) 17.

In this embodiment, not only can the interface resistance in the Schottky source/drain portion of the spin MOSFET be reduced, but also the process of forming the source/drain portion can be simplified because the impurity is supplied by self-diffusion from the magnetic layers to the silicon substrate. In particular, silicidation of the source/drain electrodes can simultaneously achieve a high spin polarization and low resistance in the source/drain electrodes. This makes it possible to form a spin MOSFET utilizing a high spin polarization.

As has been explained above, this embodiment can provide a spin MOSFET having a low-resistance electrode structure capable of efficient injection of a spin-polarized electric current, and a method of manufacturing the same.

Second Embodiment

An n-type spin MOSFET of the second embodiment of the present invention and a method of manufacturing the same will be explained below. The second embodiment is an example in which, as the source/drain electrode of a spin MOSFET, a ferromagnetic stacked film containing a magnetic material to which an impurity is added is formed on an MgO film having a tunnel barrier, and the impurity is diffused to a semiconductor substrate through the MgO film.

FIG. 10 is a sectional view showing the structure of a source/drain portion of the n-type spin MOSFET of the second embodiment. An MgO film 21 having a tunnel barrier is formed on n$^+$-type semiconductor regions (Si substrate) 12A and 12B with a thermal oxide film, and a ferromagnetic stacked film is formed on the MgO film 21. An example of the magnetic material to which the impurity is added is a (Co$_{50}$Fe$_{50}$)$_{80}$P$_{20}$ film. The stacked structure of the source/drain portion is obtained by stacking the Si substrate/the MgO film 21 (2.0 nm)/a (Co$_{50}$Fe$_{50}$)$_{80}$P$_{20}$ film 22 (10 nm)/an Ru film 23 (0.9 nm)/a CoFe film 24 (3 nm)/an IrMn film 25 (10 nm)/Ru (5 nm)/a Ta film 26 (50 nm) in this order from the underlayer. Note that the numeral in the parentheses indicates the film thickness.

Next, a method of manufacturing the stacked structure of the ferromagnetic stacked film will be explained in order. A Si substrate is cleaned with a cleaning solution mainly containing diluted HF, thereby removing a native oxide film from the surface. A portion from which no native oxide film is to be removed may be protected with a resist. Then, an MgO film 21 is deposited on a semiconductor region (Si substrate) 12. The deposition conditions are optimized to obtain a high-quality (001) crystal orientation. For example, the film is deposited by sputtering, and the Ar gas pressure and electric power are optimized. Since these values are determined according to the shape and volume of a chamber for use in sputtering and the distance between the substrate and a sputtering cathode, it is unnecessary to describe practical values. The method of depositing the MgO film 21 is not limited to sputtering, and may also be vacuum deposition, MBE (Molecular Beam Epitaxy), PLD (Pulsed Laser Deposition), or the like. In any of these methods, the internal pressure of the chamber and the deposition rate during deposition are important. More specifically, the pressure is 10$^{-6}$ Pa or less, and the deposition rate is 0.1 Å/sec in the case of MBE.

After the MgO film 21 is deposited, a (Co$_{50}$Fe$_{50}$)$_{80}$P$_{20}$ film 22 is deposited on the MgO film 21 by sputtering. However, the deposition method is not limited to sputtering, and may also be vacuum deposition, metal CVD, MBE, PLD, or the like. When the substrate temperature is room temperature, the (Co$_{50}$Fe$_{50}$)$_{80}$P$_{20}$ film 22 grows as an amorphous film immediately after deposition. Note that the (Co$_{50}$Fe$_{50}$)$_{80}$P$_{20}$ film 22 grows as a crystalline film depending on the concentration of phosphorus (P). Whether the (Co$_{50}$Fe$_{50}$)$_{80}$P$_{20}$ film 22 was amorphous or crystalline was checked after deposition by reflection high-energy electron diffraction (RHEED) in the same chamber.

As a sample different from the above-mentioned stacked structure, a thick (Co$_{50}$Fe$_{50}$)$_{80}$P$_{20}$ film (50 nm) was formed and analyzed by X-ray diffraction structural analysis (XRD). Consequently, the (Co$_{50}$Fe$_{50}$)$_{80}$P$_{20}$ film was amorphous. It is, of course, also possible to confirm this amorphous growth by observation with a transmission electron microscope (TEM). In TEM observation, however, nanocrystals are sometimes observed in addition to an amorphous layer. The nanocrystals can be controlled by changing the deposition conditions so as not to be formed. For example, the (Co$_{50}$Fe$_{50}$)$_{80}$P$_{20}$ film grew as a complete amorphous film by increasing the Ar gas pressure during sputtering to 1 Pa or more. As described previously, the MgO film 21/(Co$_{50}$Fe$_{50}$)$_{80}$P$_{20}$ film 22 are (001)-oriented/amorphous immediately after deposition.

Then, P is diffused from the (Co$_{50}$Fe$_{50}$)$_{80}$P$_{20}$ film 22 by adding annealing. P diffuses from the (Co$_{50}$Fe$_{50}$)$_{80}$P$_{20}$ film 22 to the interface with the MgO film 21, and reaches the interior of the Si substrate (semiconductor region 12) through the MgO film 21. This diffusion process can be checked by forming a large number of samples by changing the annealing time, and analyzing the samples in the direction of depth by SIMS.

Also, it was possible to confirm, by TEM observation of samples formed by changing the annealing temperature and time, that the (Co$_{50}$Fe$_{50}$)$_{80}$P$_{20}$ film 22 gradually crystallized from the interface with the MgO film 21. When using a lamp heater of a deposition apparatus, for example, samples were formed by fixing the temperature at 300° C., and changing the annealing time from 1 min to 1 hr. It was possible to confirm from these samples that the thickness of the crystallized layer increased in accordance with the annealing time. It was also possible to confirm that crystallization similarly occurred even when a sample was unloaded from the deposition apparatus, exposed to the atmosphere, and then processed by RTA. Since heating is rapid in RTA, the dependence of crystallization on time changes. The annealing time and temperature need only be designed by taking account of their integrated amounts (thermal budgets).

The crystallized (Co$_{50}$Fe$_{50}$)$_{80}$P$_{20}$ film 22 lattice-matches with the MgO (001) film 21. Since the MgO film 21 is a (001)-oriented (also called c-axis-oriented) polycrystalline material, epitaxial growth occurs in the interface of crystal grains. Also, the (Co$_{50}$Fe$_{50}$)$_{80}$P$_{20}$ film 22 is initially amorphous and then causes lattice matching by crystallization by annealing, so the film grows by solid-phase epitaxial growth.

As crystallization progresses in the interface, the amount of P as an additive reduces in the crystallized $(CO_{50}Fe_{50})_{80}P_{20}$ film 22, and the concentration increases in the interface between the MgO film and Si substrate, which is opposite to the $(CO_{50}Fe_{50})_{80}P_{20}$ film 22.

After samples were formed, annealing was performed at 280° C. for 1 hr in a magnetic field. Then, microfabrication was performed on samples having junction areas of 0.3×0.6 to 1×2 μm², and the magnetoresistance change ratio caused by the magnetic field was measured at room temperature. In the spin MOSFET of this embodiment, an MR change ratio higher than that of a comparative sample formed by epitaxial growth from the beginning was obtained at room temperature. The rest of the arrangement and effects of the second embodiment are the same as those of the first embodiment.

Third Embodiment

An n-type spin MOSFET of the third embodiment of the present invention and a method of manufacturing the same will be explained below. The third embodiment has a structure in which the area of the stacked structure of the MgO film (tunnel barrier)/ferromagnetic stacked film in the source portion is different from that in the drain portion in the second embodiment. Arsenic (As) is diffused as an impurity in n⁺-type semiconductor regions as source/drain regions. A Si substrate in which As is ion-implanted as an impurity is used as a semiconductor substrate.

Figure 11:
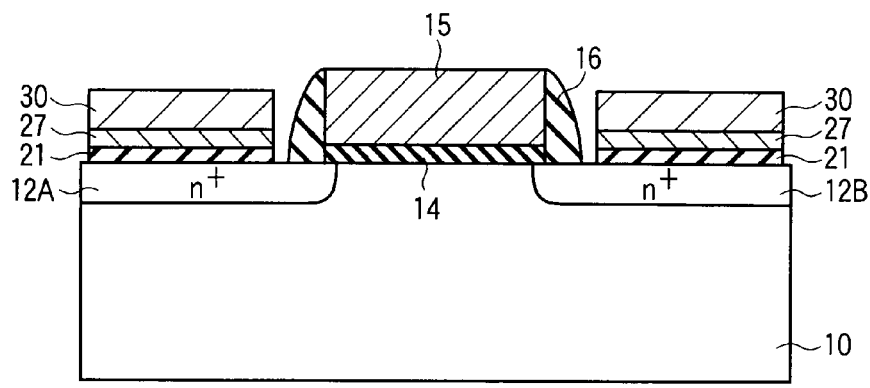
FIG. 11 is a sectional view of an n-type spin MOSFET of a third embodiment of the present invention.

FIG. 11 is a sectional view showing the structure of the n-type spin MOSFET of the third embodiment. On n⁺-type semiconductor regions 12A and 12B, MgO films (tunnel barriers) 21, $(CO_{50}Fe_{50})_{90}As_{10}$ films (magnetic layers) 27, and cap layers 30 are formed in this order from the regions 12A and 12B. As shown in FIG. 10, the cap layer 30 is a stacked film including an Ru film 23/CoFe film 24/IrMn film 25/Ru/Ta film 26. The area of the planar region of the stacked structure including the MgO film 21, $(CO_{50}Fe_{50})_{90}As_{10}$ film 27, and cap layer 30 in the source portion differs from that in the drain portion. In this embodiment, a portion having a larger planar region area functions as a fixed layer, and a portion having a smaller planar region area functions as a free layer.

As a method of making the areas of the stacked structures different in the source portion and drain portion, there is a method in which holes having different areas are formed in an interlayer dielectric film (e.g., an $SiO_2$ film), a magnetic stacked film is deposited by high-pressure RF sputtering (filling deposition), and the magnetic stacked film adhered on the interlayer dielectric film is removed by CMP (Chemical Mechanical Polish). Another method is to deposit a magnetic stacked film, perform double exposure, and make the areas different by etching.

This embodiment used the method of filling deposition. The formation of the element isolation region, the formation of the gate, and the RTA process were the same as those of a normal MOS process. After that, an interlayer dielectric film ($SiO_2$ film) was formed, and the $SiO_2$ film was planarized to some extent by etch back. Subsequently, a structure in which only the areas of MTJs in the source portion and drain portion were made different without making the aspects of the MTJs different was formed, and a magnetic stacked film was deposited (filling deposition). After that, CMP was performed on the magnetic stacked film, and an $SiO_2$ film was deposited. In addition, a via was formed in the $SiO_2$ film, and an interconnection was formed. Before the formation of the interconnection, the areas of the source portion and drain portion were measured by a SEM (Scanning Electron Microscope). The hole size of the source portion was set to 0.3 μm×0.8 μm, and that of the drain portion was set to 0.8 μm×0.8 μm. Note that the actual hole shapes were elliptic.

The stacked structure of the ferromagnetic stacked film was the Si substrate/$(CO_{50}Fe_{50})_{90}As_{10}$ film 27/cap layer 30. As a comparative sample, a Si substrate/$CO_{50}Fe_{50}$ film was formed. These samples were annealed at 280° C. for 1 hr in a magnetic field.

The annealed samples were evaluated. In this embodiment, As in the $(CO_{50}Fe_{50})_{90}As_{10}$ film diffused to the Si substrate. Accordingly, a high concentration was held maintained in the interface between the Si substrate and MgO film, and a low interface resistance was achieved. On the other hand, in the Si substrate/$CO_{50}Fe_{50}$ film of the control sample, As in the Si substrate diffused to the CoFe side, and the interface concentration between the Si substrate and MgO film decreased. From the foregoing, the significance of this embodiment was confirmed.

Further, an experiment was conducted on the n-type spin MOSFET of this embodiment as follows. That is, magnetic field write was performed with the gate being kept ON, and the antiparallel state and parallel state of spins were achieved by the coercive force difference between the magnetic materials of the source and drain, thereby reading out the resistance change ratio. In the n-type spin MOSFET of this embodiment, a high magnetoresistance change ratio was obtained via semiconductor silicon at room temperature. A similar tendency was observed in a p-type spin MOSFET having a p-n-p junction formed in a Si substrate. The rest of the arrangement and effects of the third embodiment are the same as those of the second embodiment.

Fourth Embodiment

An n-type spin MOSFET of the fourth embodiment of the present invention and a method of manufacturing the same will be explained below. The fourth embodiment is an example utilizing silicidation of the ferromagnetic stacked film in the first embodiment.

Figure 12:
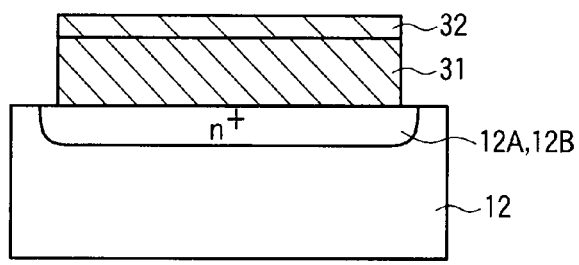
FIG. 12 is a sectional view of a source/drain portion of an n-type spin MOSFET of a fourth embodiment of the present invention.

FIG. 12 is a sectional view showing the structure of a source/drain portion of the n-type spin MOSFET of the fourth embodiment. A $(CO_2Fe_1)_{80}P_{20}$ film is used as a magnetic material, and $CO_2FeSi$ is formed as a Co-based Heusler alloy. The stacked structure of the ferromagnetic stacked film is obtained by stacking n⁺-type semiconductor regions (Si substrate) 12A and 12B/$CO_2FeSi$ film 31 (20 nm)/Ru film 32 (5 nm) in this order from the underlayer. Note that the numerals in the parentheses indicate the film thicknesses.

Next, a method of manufacturing the stacked structure of the ferromagnetic stacked film will be explained in order. The stacked structure manufacturing method is basically the same as that of the first embodiment except for silicidation, so only parts that differ will be described in detail below. First, a Si substrate is cleaned with a cleaning solution mainly containing diluted HF, thereby removing a native oxide film from the surface. A portion from which no native oxide film is to be removed may be protected with a resist. Then, as shown in FIG. 7, a $(CO_2Fe_1)_{80}P_{20}$ film (magnetic layer) about 10 nm thick is formed on a semiconductor region 12 by sputtering. That is, the $(CO_2Fe_1)_{80}P_{20}$ film is deposited in contact with the source/drain region of the spin MOSFET.

After that, annealing at 300° C. for about 30 sec and annealing at 500° C. for about 30 sec are sequentially performed by RTA as annealing processes. This diffuses phosphorus (P) of the $(CO_2Fe_1)_{80}P_{20}$ film from the surface to the interior of the semiconductor region 12. This simultaneously causes silicidation of CoFe. Since the composition ratio of Co to Fe in the $(Co_2Fe_1)_{80}P_{20}$ film is 2:1 as an atomic ratio, CoFe changes into a full-Heusler alloy having a stoichiometric composition of $Co_2FeSi$.

To check the dependence of crystallization of the $Co_2FeSi$ film 31 on the annealing conditions, samples were formed by, e.g., fixing the initial temperature at 300° C. and changing the annealing time from a few min to 1 hr by using a lamp heater of a deposition apparatus. When these samples were evaluated, it was possible to confirm that the thickness of the crystallized layer of the $Co_2FeSi$ film increased in accordance with the annealing time. It was also possible to confirm that crystallization of the $Co_2FeSi$ film similarly occurred even when a sample was unloaded from the deposition apparatus, exposed to the atmosphere, and then processed by RTA. Since heating is rapid in RTA, the dependence of crystallization of the $Co_2FeSi$ film on time changes. The annealing time and temperature need only be designed by taking account of their integrated amounts (thermal budgets).

Note that the method of depositing the $(Co_2Fe_1)_{80}P_{20}$ film is not limited to sputtering, and may also be vacuum deposition, metal CVD, MBE, PLD, or the like. However, an amorphous film is favorable as initial growth. This is so because when an amorphous film is grown, island-like growth can be avoided when crystallization occurs after that, and a flat interface is formed between the Si substrate and $Co_2FeSi$ film 31. Whether the film was deposited as an amorphous film was checked after deposition by reflection high-energy electron diffraction (RHEED) in the same chamber. Also, as a sample different from the stacked structure, a 50-nm thick $(Co_2FeSi)_{80}P_{20}$ film was formed on an Si substrate by the above-mentioned method, and analyzed by X-ray diffraction structural analysis (XRD). Consequently, a film that was initially amorphous crystallized after annealing. Also, the $Co_2FeSi$ film 31 grows as a polycrystalline film depending on the annealing conditions, the thickness of the semiconductor region (Si layer) 12, and the thickness of the $(Co_2Fe_1)_{80}P_{20}$ film. This film can be evaluated by XRD separately from Si. When the film grew as a single-crystal film, however, the film well lattice-matched with Si and hence was evaluated by TEM. Although single-crystal growth is unessential, it makes it possible to form a flat steep interface between the Si substrate and $Co_2FeSi$ film 31. This is advantageous in forming a very shallow junction in the spin MOSFET.

Note that it was also confirmed that phosphorus (P) remained in the magnetic layer, but the existence of P hardly deteriorates the magnetoresistance. On the contrary, the magnetic properties change and effectively reduce the saturation magnetization (Ms). The reduction in saturation magnetization is useful for spin transfer magnetization reversal.

In this embodiment, not only can the interface resistance in the Schottky type source/drain portion of the spin MOSFET be reduced, but also the process of forming the source/drain portion can be simplified because the impurity is supplied by self-diffusion from the magnetic layer to the silicon substrate. In particular, silicidation of the source/drain electrode can simultaneously achieve a high spin polarization and low resistance of the source/drain electrode. In addition, a Heusler alloy layer can be formed regardless of the underlayer. This makes it possible to form a spin MOSFET utilizing a high spin polarization of the Heusler alloy. The rest of the arrangement and effects of the fourth embodiment are the same as those of the first embodiment.

Fifth Embodiment

A spin MOSFET of the fifth embodiment of the present invention and a method of manufacturing the same will be explained below. The fifth embodiment is an example in which a ferromagnetic stacked film having an MTJ structure is formed in a source/drain portion.

Figure 13:
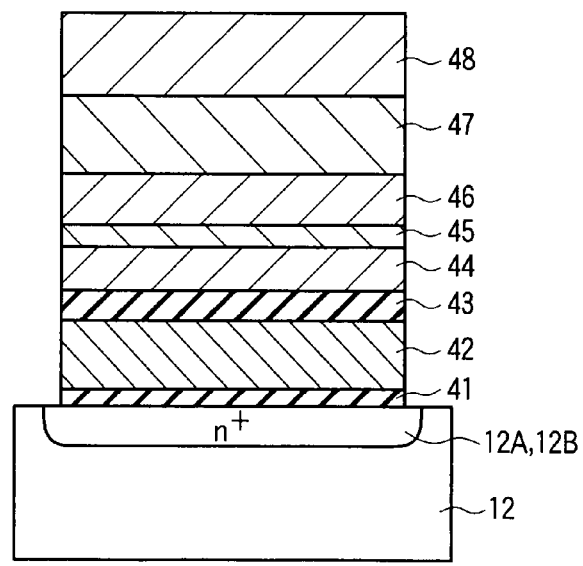
FIG. 13 is a sectional view of a source/drain portion of an n-type spin MOSFET of a fifth embodiment of the present invention.

FIG. 13 is a sectional view showing the structure of the source/drain portion of the spin MOSFET of the fifth embodiment. In this embodiment, a $(Co_{75}Fe_{25})_{90}P_{10}$ film is used as a magnetic material. The stacked structure of the ferromagnetic stacked film is obtained by stacking $n^+$-type semiconductor regions (Si substrate) 12A and 12B/MgO film 41 (1.0 nm)/$(Co_{75}Fe_{25})_{90}P_{10}$ film 42 (5 nm)/MgO film 43 (1.0 nm)/$Co_{50}Fe_{50}$ film 44 (5 nm)/Ru film 45 (0.9 nm)/$Co_{90}Fe_{10}$ film 46 (3 nm)/IrMn film 47 (10 nm)/Ru (5 nm)/Ta film 48 (50 nm) in this order from the underlayer. Note that the numeral in the parentheses indicates the film thickness.

The spin MOSFET manufacturing method of the fifth embodiment is basically the same as that of the first embodiment except for a method of manufacturing the stacked structure of the ferromagnetic stacked film, so this manufacturing method will be described in detail below. First, a 1.0-nm thick MgO film 41 having a tunnel barrier is deposited on a semiconductor region 12. A $(Co_{75}Fe_{25})_{90}P_{10}$ film 42 is deposited on the MgO film 41. After that, it is confirmed that the $(Co_{75}Fe_{25})_{90}P_{10}$ film 42 is an amorphous film.

Then, an MgO film 43 having a tunnel barrier is deposited on the $(Co_{75}Fe_{25})_{90}P_{10}$ film 42. Sputtering was used as the method of depositing the $(Co_{75}Fe_{25})_{90}P_{10}$ film 42. However, the deposition method is not limited to sputtering and may also be vacuum deposition, metal CVD, MBE, PLD, or the like, and it is important to perform deposition under conditions by which the $(Co_{75}Fe_{25})_{90}P_{10}$ film 42 grows as an amorphous film. Whether the $(Co_{75}Fe_{25})_{90}P_{10}$ film was deposited as an amorphous film was checked after deposition by reflection high-energy electron diffraction (RHEED) in the same chamber.

The deposition conditions of the MgO film 43 are optimized to obtain a high-quality (001) crystal orientation. Since the $(Co_{75}Fe_{25})_{90}P_{10}$ film 42 as the underlayer of the MgO film 43 is amorphous, the MgO film 43 readily forms a (001) film.

After the MgO film 43 is deposited, annealing is performed to crystallize the $(Co_{75}Fe_{25})_{90}P_{10}$ film 42 and diffuse phosphorus (P). It is important to perform annealing before the $Co_{50}Fe_{50}$ film 44 is deposited on the MgO film 43. This is so because if annealing is performed after the $Co_{50}Fe_{50}$ film 44 is deposited, P having diffused from the $(Co_{75}Fe_{25})_{90}P_{10}$ film 42 reaches the $Co_{50}Fe_{50}$ film 44 above the $(Co_{75}Fe_{25})_{90}P_{10}$ film 42.

Note that it was possible to confirm, by TEM observation of samples formed by changing the annealing temperature and time, that the $(Co_{75}Fe_{25})_{90}P_{10}$ film 42 gradually crystallized from the interface with the MgO film. For example, samples were formed by fixing the temperature at 300° C. and changing the annealing time from 1 min to 1 hr by using a lamp heater of a deposition apparatus. It was possible to confirm from these samples that the thickness of the crystallized layer increased in accordance with the annealing time. It was also possible to confirm that crystallization similarly occurred even when a sample was unloaded from the deposition apparatus, exposed to the atmosphere, and then processed by RTA. Since heating is rapid in RTA, the dependence of crystallization on time changes. The annealing time and temperature need only be designed by taking account of their integrated amounts (thermal budgets).

The crystallized $(Co_{75}Fe_{25})_{90}P_{10}$ film 42 lattice-matches with the interface with the MgO (001) film. Since the MgO film is a (001)-oriented (also called c-axis-oriented) polycrystalline material, epitaxial growth occurs in the interface of crystal grains. Also, the $(Co_{75}Fe_{25})_{90}P_{10}$ film 42 is initially amorphous and then causes lattice matching by crystallization by the annealing, so the film grows by solid-phase epitaxial growth.

Subsequently, a CoFe film 44 as an upper electrode is deposited on the MgO film 43. After that, stacked films on the CoFe film 44 are sequentially deposited by general sputtering. The stacked structure includes the $Co_{50}Fe_{50}$ film 44 (5 nm)/Ru film 45 (0.9 nm)/$Co_{90}Fe_{10}$ film 46 (3 nm)/IrMn film 47 (10 nm) in order to fix the magnetization direction as a stacked ferri structure. The Ru/Ta film 48 formed on the IrMn film 47 functions as a cap layer and interconnection layer.

In this embodiment, phosphorus (P) diffuses to the underlying Si substrate through the MgO film, so the interface resistance between the Si substrate and MgO film can be decreased. Also, in this embodiment, solid-phase epitaxial growth forms a high-quality, lattice-matched interface as the interface between the $(Co_{75}Fe_{25})_{90}P_{10}$ film 42 and MgO film. Accordingly, a high magnetoresistance can be obtained.

The embodiments of the present invention can provide a spin transistor having a low-resistance electrode structure capable of efficient injection of a spin-polarized electric current, and a method of manufacturing the same.

In addition, the above-mentioned embodiments can be performed not only singly but also as appropriate combinations. Furthermore, the above embodiments include inventions in various stages, so the inventions in various stages can also be extracted by properly combining a plurality of constituent elements disclosed in the individual embodiments. For example, the structure shown in FIG. 10 of the second embodiment, the structure shown in FIG. 12 of the fourth embodiment, and the structure shown in FIG. 13 of the fifth embodiment are applicable to at least one of the source/drain portions shown in, e.g., FIG. 9 of the first embodiment and FIG. 11 of the third embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a spin transistor comprising:
forming a gate electrode on a semiconductor substrate;
forming a source electrode on the semiconductor substrate; and
forming a drain electrode on the semiconductor substrate,
wherein at least one of the forming the source electrode and the forming the drain electrode includes
forming a magnetic layer containing an impurity on the semiconductor substrate; and
annealing the magnetic layer to form at least one of a source diffusion layer and a drain diffusion layer by diffusing the impurity contained in the magnetic layer into the semiconductor substrate, and change the magnetic layer into a Heusler alloy.

2. The method according to claim 1, further comprising forming a tunnel barrier layer on the semiconductor substrate before forming the magnetic layer, and
wherein in annealing the magnetic layer, the impurity contained in the magnetic layer is diffused into the semiconductor substrate through the tunnel barrier layer.

3. The method according to claim 1, wherein the impurity includes at least one element selected from the group consisting of lithium (Li), phosphorus (P), arsenic (As), antimony (Sb), and bismuth (Bi), at least one of the source diffusion layer and the drain diffusion layer is of an n-type.

4. The method according to claim 1, wherein the impurity includes at least one element selected from the group consisting of boron (B), aluminum (Al), gallium (Ga), indium (In), magnesium (Mg), and beryllium (Be), and at least one of the source diffusion layer and the drain diffusion layer is of a p-type.

5. A method of manufacturing a spin transistor comprising:
forming a gate electrode on a semiconductor substrate;
forming a source electrode on the semiconductor substrate; and
forming a drain electrode on the semiconductor substrate,
wherein at least one of the forming the source electrode and the forming the drain electrode includes
forming a magnetic layer containing an impurity on the semiconductor substrate; and
annealing the magnetic layer to form at least one of a source diffusion layer and a drain diffusion layer by diffusing the impurity contained in the magnetic layer into the semiconductor substrate, and form one of a magnetic silicide layer and a magnetic germanide layer by performing one of silicidation and germanization of the magnetic layer,
wherein the magnetic silicide layer has a spin polarization higher than that of the magnetic layer.

6. The method according to claim 5, wherein the impurity includes at least one element selected from the group consisting of lithium (Li), phosphorus (P), arsenic (As), antimony (Sb), and bismuth (Bi), and at least one of the source diffusion layer and the drain diffusion layer is of an n-type.

7. The method according to claim 5, wherein the impurity includes at least one element selected from the group consisting of boron (B), aluminum (Al), gallium (Ga), indium (In), magnesium (Mg), and beryllium (Be), and at least one of the source diffusion layer and the drain diffusion layer is of a p-type.

8. The method according to claim 2, wherein in forming the magnetic layer, the magnetic layer contains an amorphous layer, and the amorphous layer contained in the magnetic layer is crystallized by annealing the magnetic layer.

9. The method according to claim 1, further comprising forming a gate insulating film on the semiconductor substrate before forming the gate electrode.

10. The method according to claim 5, further comprising forming a gate insulating film on the semiconductor substrate before forming the gate electrode.

11. A method of manufacturing a spin transistor comprising:
forming a gate electrode on a semiconductor substrate;
forming a source electrode on the semiconductor substrate; and
forming a drain electrode on the semiconductor substrate,
wherein at least one of the forming the source electrode and the forming the drain electrode includes
forming a magnetic layer containing an impurity on the semiconductor substrate; and
annealing the magnetic layer to form a semiconductor region having a low resistance by diffusing the impurity contained in the magnetic layer into the semiconductor substrate, and change the magnetic layer into a Heusler alloy.

12. The method according to claim 11, wherein the impurity includes at least one element selected from the group consisting of lithium (Li), phosphorus (P), arsenic (As), antimony (Sb), and bismuth (Bi), and the semiconductor region is of an n-type.

13. The method according to claim 11, wherein the impurity includes at least one element selected from the group consisting of boron (B), aluminum (Al), gallium (Ga), indium (In), magnesium (Mg), and beryllium (Be), and the semiconductor region is of a p-type.

14. A method of manufacturing a spin transistor comprising:
forming a gate electrode on a semiconductor substrate;
forming a source electrode on the semiconductor substrate; and
forming a drain electrode on the semiconductor substrate,
wherein at least one of the forming the source electrode and the forming the drain electrode includes
forming a magnetic layer containing at least one element of lithium (Li), phosphorus (P), arsenic (As), antimony (Sb), and bismuth (Bi), boron (B), aluminum (Al), gallium (Ga), indium (In), magnesium (Mg), and beryllium (Be) on the semiconductor substrate; and
annealing the magnetic layer to form a semiconductor region by diffusing at least said one element contained in the magnetic layer into the semiconductor substrate, and change the magnetic layer into a Heusler alloy.

15. The method according to claim 14, wherein said at least one element includes at least one element selected from the group consisting of lithium (Li), phosphorus (P), arsenic (As), antimony (Sb), and bismuth (Bi), and the semiconductor region is of an n-type.

16. The method according to claim 14, wherein said at least one element includes at least one element selected from the group consisting of boron (B), aluminum (Al), gallium (Ga), indium (In), magnesium (Mg), and beryllium (Be), and the semiconductor region is of a p-type.

\* \* \* \* \*